(12) United States Patent
Furukawa et al.

(10) Patent No.: US 6,320,207 B1
(45) Date of Patent: Nov. 20, 2001

(54) LIGHT EMITTING DEVICE HAVING FLAT GROWTH GAN LAYER

(75) Inventors: Chisato Furukawa, Atsugi; Masayuki Ishikawa, Yokohama; Hideto Sugawara; Kenji Isomoto, both of Kawasaki, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 08/844,616

(22) Filed: Apr. 21, 1997

(30) Foreign Application Priority Data

Apr. 22, 1996 (JP) .................................................. 8-099891

(51) Int. Cl.$^7$ .................................................. H01L 33/00
(52) U.S. Cl. .......................................... 257/101; 257/103
(58) Field of Search .............................. 257/94, 101, 103, 257/102; 372/44, 45

(56) References Cited

U.S. PATENT DOCUMENTS 5,751,013 * 5/1998 Kidoguchi et al. ................... 257/103

* cited by examiner

*Primary Examiner*—Minh Loan Tran
(74) *Attorney, Agent, or Firm*—Finnegan, Henderson, Farabow, Garrett & Dunner, L.L.P.

(57) ABSTRACT

A light emitting device has an N-type gallium nitride system compound semiconductor layer provided on a substrate; and a P-type gallium nitride system compound semiconductor layer provided on said N-type gallium nitride system compound semiconductor layer. The N-type gallium nitride compound semiconductor layer has such an area that an impurity concentration increases corresponding to a layer thickness from the side of said substrate.

15 Claims, 5 Drawing Sheets

LIGHT EMITTING DEVICE HAVING FLAT GROWTH GAN LAYER

BACKGROUND OF THE INVENTION

The present invention relates generally to a light emitting device and a method of manufacturing the light emitting device and, more particularly, to a structure of the light emitting device such as a light emitting diode and a semiconductor laser and a manufacturing method thereof.

Known hitherto as a practical material of the light emitting device is a gallium nitride system compound semiconductor of gallium nitride (GaN), indium gallium nitride (InGaN) and gallium aluminum nitride (GaAlN).

The following are explanations of a structure of the light emitting diode, a manufacturing method thereof and problems inherent therein by way of one example of the light emitting device manufactured by use of the above materials with reference to FIGS. 7A, 7B, 8A and 8B.

Figure 7A:
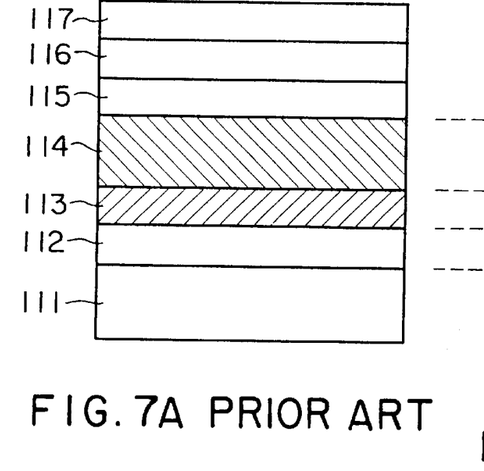
FIG. 7A is a sectional view illustrating a light emitting diode in the prior art.
Figure 7B:
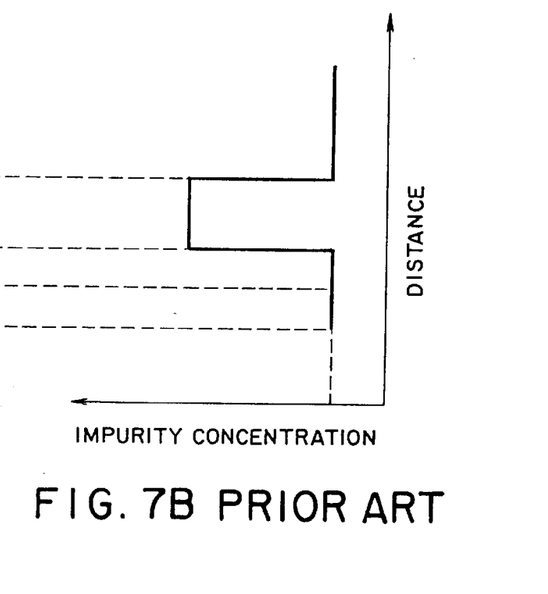
FIG. 7B is a diagram showing an impurity profile of an N-type impurity.
Figure 8A:
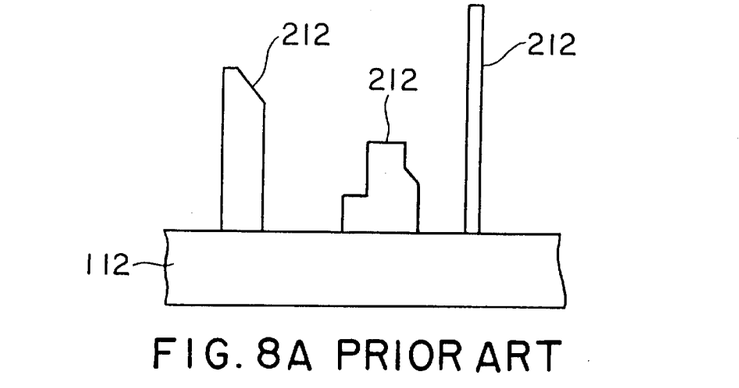
FIGS. 8A and 8B are explanatory schematic diagrams showing problems inherent in the prior art.
Figure 8B:
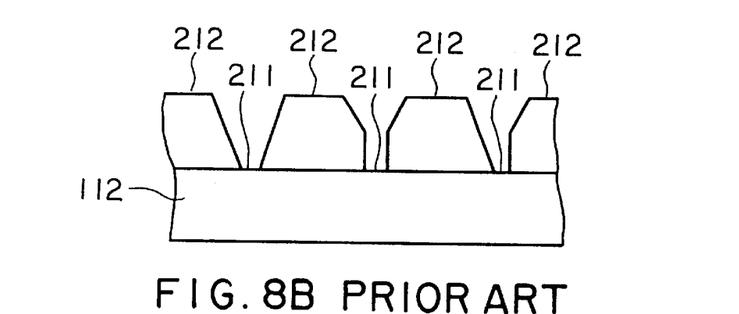

FIG. 7A is a sectional view illustrating the light emitting diode having a heterojunction, wherein a plurality of grown layers are formed based on an epitaxial growth. Further, FIG. 7B shows a profile of N-type impurities in the light emitting diode shown in FIG. 7A, wherein the axis of abscissa indicates an impurity concentration of the N-type impurity while the axis of ordinates indicates a distance from the underside of a substrate, corresponding to FIG. 7A.

The prior art light emitting diode is, as illustrated in FIG. 7A, constructed of stacking of grown layers such as a buffer layer 112 (a first GaN layer) composed of amorphous GaN, a spacer layer 113 (a second GaN layer) composed of monocrystalline GaN, a high-concentration N-type layer 114 (a third GaN layer) doped with the N-type impurity at a high concentration, an active layer 115 (an InGaN layer) composed of InGaN, an AlGaN layer 116 doped with a P-type impurity, and a contact layer (a fourth GaN layer) doped with the P-type impurity at a high concentration on the surface of a substrate 111 composed of sapphire and SiC.

The impurity concentration of the N-type impurity is on the order of $1$–$5 \times 10^{18}$ atoms•cm$^{-3}$ in the third GaN layer. In other layers, the impurity concentration of the N-type impurity is on the order of $1 \times 10^{15}$ atoms•cm$^{-3}$ defined as a background level. Further, these respective grown layers are formed by changing temperatures and sorts of gasses introduced thereinto, which involves the use of a vapor phase growth method such as a MO-CVD (Metal Organic Chemical Vapor Deposition) method. In the configuration given above, the second GaN layer 113 is formed by introducing hydrogen as a carrier gas, and ammonia (NH$_3$) and TMGa (trimethyl gallium) as raw gases into the reaction chamber at 1000° C.–1100° C., and thereafter the third GaN layer 114 is so formed as to be doped with the N-type impurity at a high concentration by further supplying SiH$_4$ (silane gas) while consecutively introducing the above gases. Incidentally, it is desirable that the second GaN layer has a thickness of 0.01 µm or larger, and the third GAN layer has a thickness of 0.1 µm.

By the way, the second GaN layer 113 is not functionally necessary essentially. Namely, if the third GaN layer doped with the N-type impurity at the high concentration is provided on the first GaN layer functionally provided as the buffer layer, the operation required of the light emitting device is to be performed. When a high-concentration monocrystalline GaN layer is provided on the surface of an amorphous GaN layer, however, as shown in, e.g., FIGS. 8A and 8B, a pin hole 211 is produced in the surface of the first GaN layer 112, or an abnormal growth 212 of the GaN layer with a dopant being a core, might occurs in some cases. Accordingly, in the prior art light emitting diode, the monocrystalline second GaN layer 113 is provided as a spacer layer on the surface of the first GaN layer 112, and subsequently the fourth GaN layer 114 doped the N-type impurity at a high concentration is formed.

As described above, in the semiconductor device using the prior art gallium nitride system compound semiconductor, when forming a high-concentration N-type layer under the active layer functioning as a light emitting layer, an undoped monocrystalline GaN layer is previously provided as a spacer layer beneath the high-concentration N-type layer in order to enhance the crystallinity thereof. Although the vapor phase growth method such as the MO-CVD method and so on for forming those respective grown layers, there must be formed the originally functionally unnecessary layer exhibiting a low growth velocity, and this results in a decreases in terms of throughput. Further, as the functionally unrequited layer is to be formed, the thickness of the entire light emitting device is to increase. When the layer thickness increases, a distortion quantity of each grown layer enlarges due to a lattice unjointed state, with the result that the functionally necessary grown layers must be deteriorated.

SUMMARY OF THE INVENTION

It is a primary object of the present invention, which was contrived in view of the above problems, to provide a novel light emitting device using a gallium nitride system compound semiconductor and a manufacturing method thereof enough to enhance a quality and a throughput thereof when manufacturing the light emitting device.

To accomplish the above object, according to one aspect of the present invention, a light emitting device comprises a substrate, a first N-type gallium nitride system compound semiconductor layer provided on the substrate so as to increase an impurity concentration from an impurity concentration of a first N-type impurity to an impurity concentration of second N-type impurity, a second N-type gallium nitride system compound semiconductor layer having the impurity concentration of the second N-type impurity and provided on the first N-type gallium nitride system compound semiconductor layer, and a P-type gallium nitride system semiconductor layer provided on the second N-type gallium nitride system compound semiconductor layer. Further, an impurity concentration of an N-type impurity in the first N-type gallium nitride system compound semiconductor layer changes exponent-functionwise or rectilinearly or curvilinearly of saturation or stepwise corresponding to a layer thickness. Moreover, the impurity concentrations of the first and second N-type impurities fall within a range of $1 \times 10^{-13}$ atoms•cm$^{-3}$ to $1 \times 10^{23}$ atoms•cm$^{-3}$. Also, a thickness of the first N-type gallium nitride compound semiconductor layer falls within a range of 0.01 to 2.00 µm.

According to another aspect of the present invention, a method of manufacturing a light emitting device, comprises a step of providing a first gallium nitride system compound semiconductor layer on a substrate in a reaction chamber, and a step of providing a second N-type gallium nitride system compound semiconductor layer doped with an N-type impurity on the surface of the first gallium nitride system compound semiconductor layer with SiH$_4$ introduced as a doping gas. Based on this manufacturing method, the second N-type gallium nitride system compound semiconductor layer is formed by increasing an impurity concentration thereof from the side of the substrate, which involves changing a flow quantity of $SiH_4$ to be introduced into the reaction chamber.

According to the present invention, without forming an undoped monocrystalline GaN layer as a spacer layer that has hitherto been formed in the prior art light emitting device, the N-type modulation doped layer and the high-concentration N-type layer can be provided on the surface of the buffer layer, exhibiting a stabilized crystallinity with no abnormal growth only by consecutively changing the flow quantity of the silane gas. Hence, the throughput relative to manufacturing the light emitting device can be enhanced. Further, the thickness of the whole light emitting device can be reduced to some extent, and therefore it is feasible to prevent both the distortion quantity from enlarging due to the lattice mismatching and the grown layers from being deteriorated.

DESCRIPTION OF THE PREFERRED EMBODIMENTS

Embodiment 1

Figure 1A:
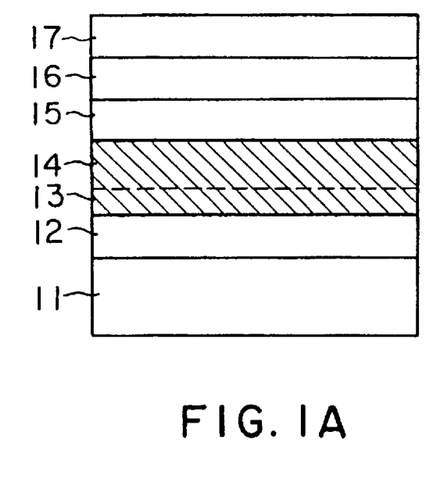
FIG. 1A is an explanatory sectional view showing a light emitting diode in an embodiment of the present invention.
Figure 1B:
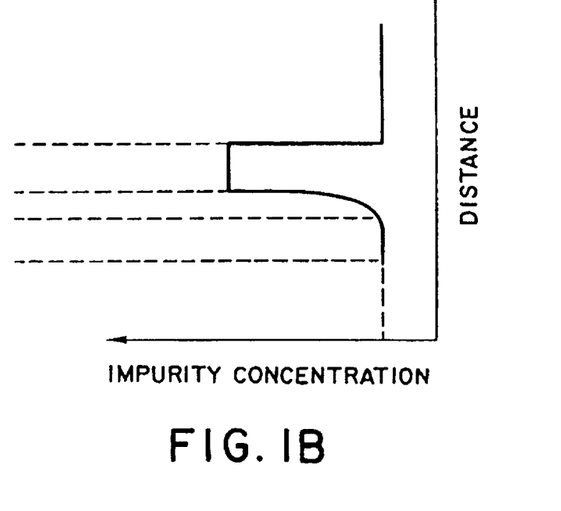
FIG. 1B is a diagram showing a profile of an N-type impurity.

To start with, a structure of a light emitting device according to the present invention will be described with reference to FIGS. 1A and 1B. FIG. 1A is a sectional view illustrating a light emitting diode containing anisotype heterostructures, wherein a plurality of grown layers are formed based on an epitaxial growth. FIG. 1B shows a profile of an N-type impurity in the light emitting diode shown in FIG. 1A, wherein the axis of abscissa indicates an impurity concentration of the N-type impurity while the axis of ordinates indicates a distance from the underside of a substrate, corresponding to FIG. 1A.

The light emitting diode according to the present invention is constructed of a stacked construction of a buffer layer 12 (a first GaN layer) composed of amorphous GAN having a layer thickness on the order of 0.01 $\mu$m–2.00 $\mu$m, an N-type modulation doped layer 13 (termed a second GaN layer for convenience) having a thickness on the order of 0.01 $\mu$m 0.05 $\mu$m with an impurity concentration of the N-type impurity changing from a background level of, e.g., $1\times10^{13}$ atoms·cm$^{-3}$ to a desired impurity concentration of, e.g., $1\times10^{23}$ atoms·cm$^{-3}$, a high concentration N-type layer 14 (a third GaN layer) that is 0.01 $\mu$m or larger in thickness, an N-impurity concentration of which is a desired concentration of, e.g., $1\times10^{23}$ atoms·cm$^{-3}$, an active layer 15 having a thickness of 0.01 $\mu$m–0.03$\mu$ and composed of InGaN, an AlGAN layer 16 having a thickness of 0.1 $\mu$m–0.3 $\mu$m and doped with P-type impurity, and a contact layer (a fourth GaN layer) having a thickness of 0.05 $\mu$m or larger, doped with the P-type impurity at a high concentration and composed of GaN on a surface of a substrate 11 composed of sapphire.

Note that the thickness of each layer and the impurity concentration are not confined to only the numerical values given above. In particular, the impurity concentration of the third GaN layer may fall within a range of more than $1\times10^{13}$ atoms·cm$^{-3}$ to less than $1\times10^{23}$ atoms·cm$^{-3}$, and, along with this, the impurity concentration of the third GAN layer may change from the impurity concentration of the first GaN layer to the impurity concentration of the third GaN layer.

Herein, a configuration different from that of the prior art light emitting device is that the N-type modulation doped layer 13 provided substitute for the spacer layer (the second GaN layer) hitherto provided, and, in continuity from this, the high concentration N-type layer 14 is provided. That is, according to the present invention, the N-type layers needed for the operation are so provided on from the surface of the buffer layer as to gradually increase the N-type impurity concentration without providing the layers that are not originally required in terms of function.

The N-type impurity concentration increases so as to be on the order or $1\times10^{23}$ atoms·cm$^{-3}$ in the third GaN layer, the background level in the second GaN layer on the substrate side and $1\times10^{18}$ atoms·cm$^{-3}$. There might be a variety of conceivable modes of how the n-type impurity concentration changes. These modes will be explained with reference to FIG. 2. Note that, in FIG. 2, the axis of abscissa indicates principally a distance (a range shown by a reference numeral 14 in FIG. 2) from the second GaN layer on the substrate side, while the axis of ordinates indicates an impurity concentration.

Figure 2:
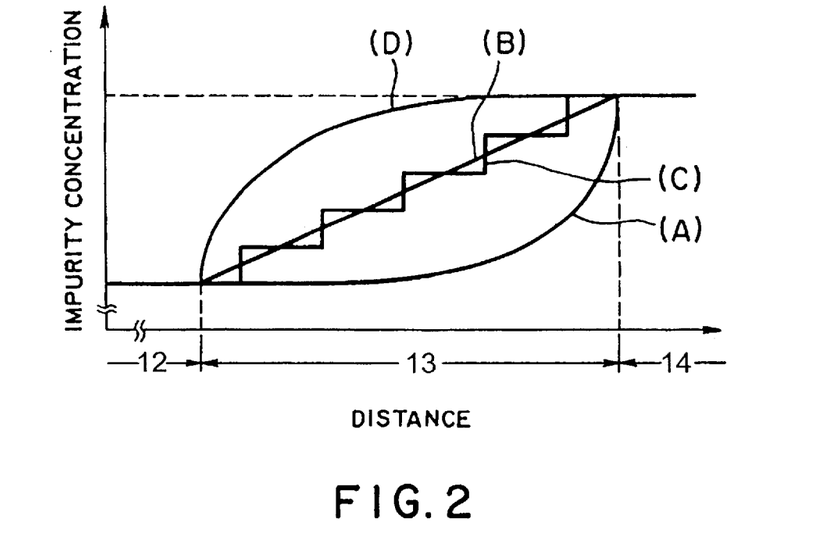
FIG. 2 is a diagram showing an impurity profile in an N-type modulation doped layer according to the present invention.

It is desirable that the impurity concentration be changed exponent-functionwise so as to be slight on the substrate side but large on the side of the third GaN layer as indicated by (A) in FIG. 2. It is because the N-type modulation doped layer grown on the surface of the first GaN layer requires a finite thickness enough not to produce a pin hole, and the N-type modulation doped layer formed having a thickness enough not to produce this pin hole is stably crystal-grown eve by gradually increasing the impurity concentration thereafter.

Embodiment 2

A second embodiment of the present invention will be discussed referring to a line (B) shown in FIG. 2. As indicated by the line (B) in FIG. 2, the N-type modulation doped layer is formed, with the impurity concentration increasing rectilinearly from the substrate side and reaching the impurity concentration of the third N-type GaN layer. It is feasible to reduce fluctuations in growth rate and doping efficiency by executing such a modulation dope method.

For instance, a variation in sort of the gas from a gas supply system that is caused on the occasion of supplying a doping gas, might lead to an occurrence of a slight fluctuation just before reaching the substrate or when cooling off an atmospheric gas on the substrate. Herein, when the doping gas is linearly changed, a growth temperature is kept unchanged because of temperature control catching up with the change. Hence, the fluctuations in the growth rate and in the doping efficiency due to the temperatures, are reduced.

Embodiment 3

A third embodiment of the present invention will be described with reference to a line (C) shown in FIG. 2. As indicated by the line (C) in FIG. 2, the N-type modulation doped layer is formed, with the impurity concentration increasing stepwise and reaching the impurity concentration of the third N-type GaN layer. When such modulation doping is carried out, it follows that the growth goes on while restoring the growth surface, and hence it if possible to provide the N layer doped at a high concentration on the modulation doped layer grown in a relatively short time or as a comparatively thin layer.

Further, an excellent flatness of the growth surface is given because of being grown while restoring the crystallinity. For actualizing this effect, an undoped layer may be interposed therein in an extreme case.

Further, a single step of this sort may be sufficient for obtaining the effect thereof.

Embodiment 4

A fourth embodiment of the present invention will be discussed referring to a curve (D) in FIG. 2. As indicated by the curve (D) in FIG. 2, the N-type modulation doped layer is formed so that the impurity concentration increases curvilinearly of saturation from the substrate side. When forming such a modulation doped layer, a low concentration area in the modulation doped layer can be set at the minimum. Therefore, a growth time can be reduced by decreasing the whole growth thickness. Hence, the step exhibiting a high throughput can be provided when a large number of devices are produced.

Embodiment 5

Figure 3A:
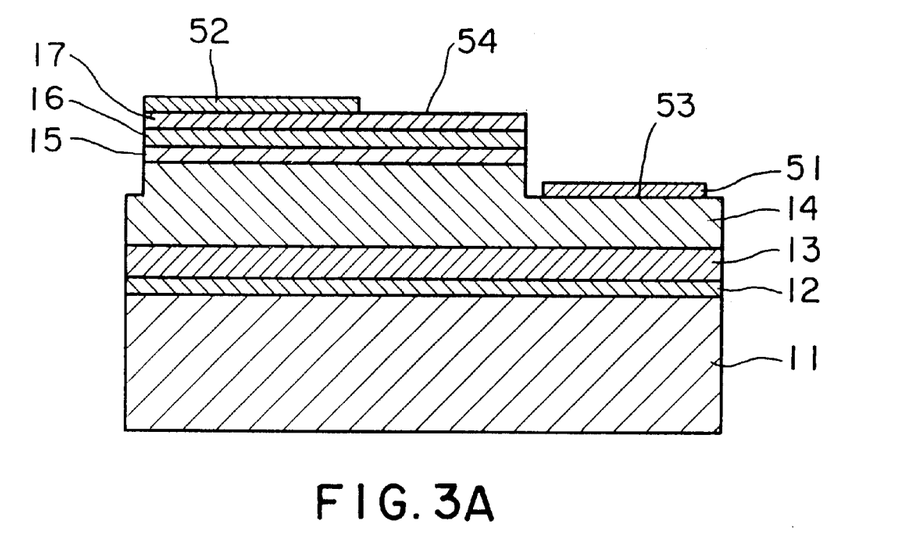
FIG. 3A is a sectional view showing a gallium nitride system compound semiconductor.

A fifth embodiment of the present invention of the present invention will be explained with reference to FIGS. 3A and 3B. FIG. 3A is a sectional view showing how a gallium nitride system compound semiconductor provided in the fifth embodiment is constructed as a device.

Figure 3B:
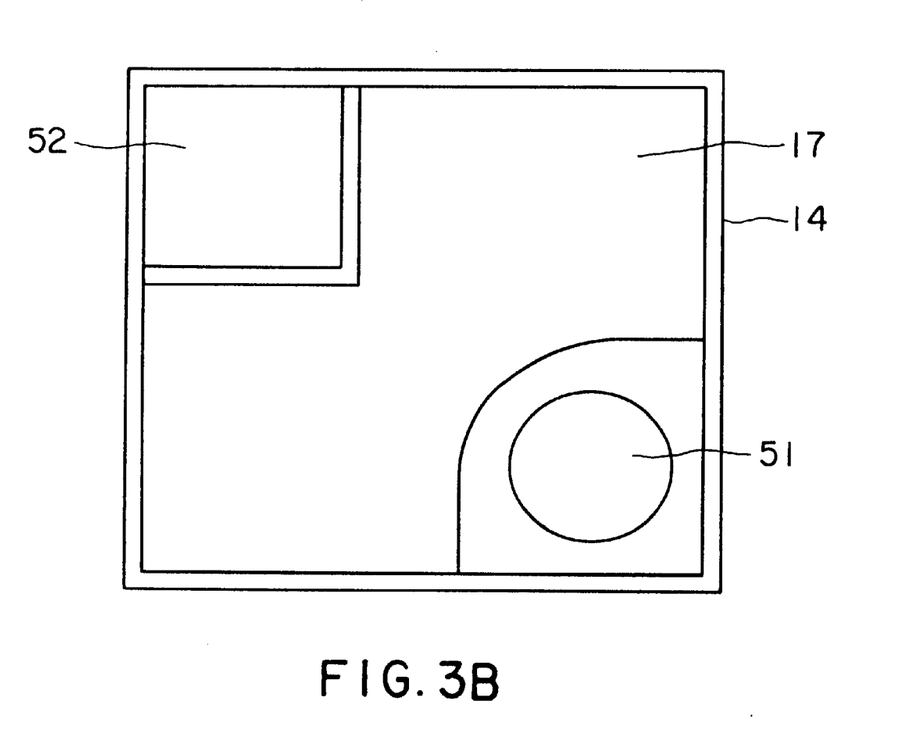
FIG. 3B is a top view showing the device in FIG. 3A as viewed from above.

FIG. 3B is a view (top view) of the device in FIG. 3A as viewed from above. The reference numerals 51 and 52 in FIG. 3B designate an n-type electrode and a p-type electrode. Employed herein is a wafer that is crystal-grown by use of either one of the methods in the embodiments 1–4 discussed so far. The wafer is effected patterning thereon, and a dry etching such as RIE (Reactive Ion Etching), RIBE (Reactive Ion Beam Etching) and CDE (Chemical Dry Etching) is performed. A surface 53 after being etched is obtained in the high-concentration N-type GaN layer 14.

Herein, a thickness of the high-concentration N-type GaN layer 14 might require a fixed standard value (determined by a carrier concentration and a mobility) to flow the electric current in the horizontal direction.

Then an N-type electrode is provided on the surface 53 of this high-concentration N-type GaN layer 14. Subsequently, a p-type electrode 52 is provided on a surface 54 of the contact layer 17. Note that these p- and n-surfaces are passivated by an insulating layer and a dielectric thin layer, including a p/n interface. Thereafter the wafer is separated through dicing and scribing to obtain device chips having predetermined configurations.

Figure 5A:
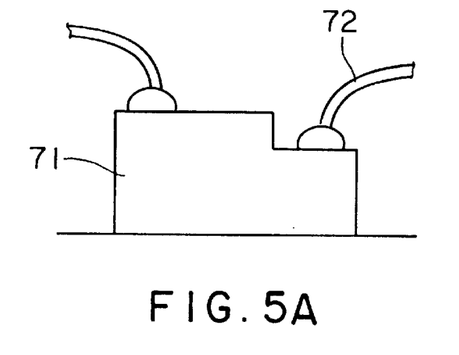
FIGS. 5A and 5B are views showing how wires are bonded to electrode pads.
Figure 5B:
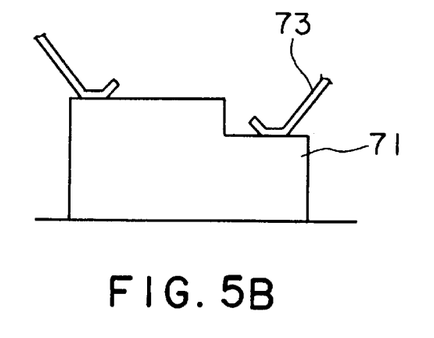
Figure 5C:
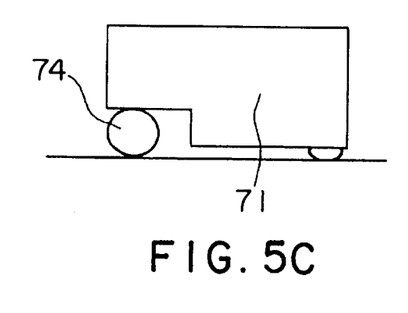
FIG. 5C is a view showing wedge bonding.
Figure 5D:
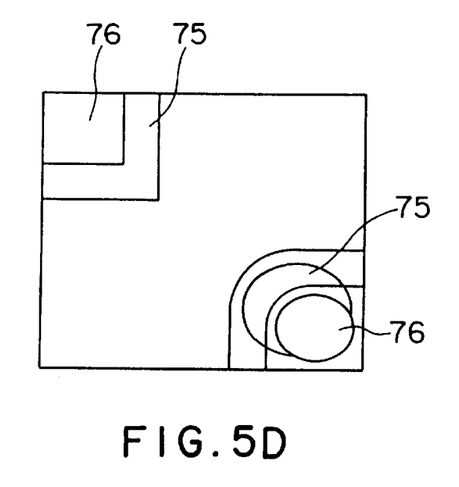
FIG. 5D is a top view showing a case where the wedge bonding in FIG. 5B is applied.
Figure 5E:
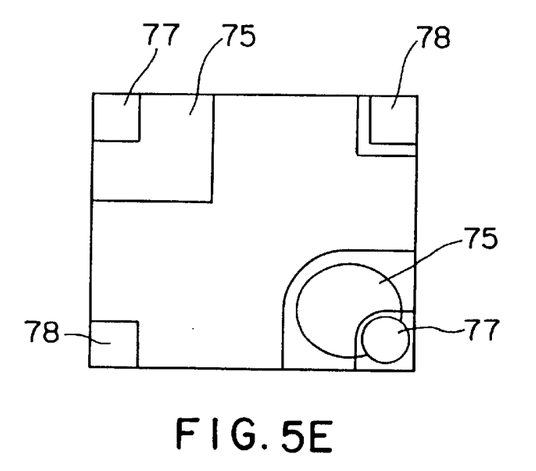
FIG. 5E is a top view when the flip chip mounting in FIG. 5C is applied.

These separated chips are mounted and assembled as illustrated in FIGS. 5A–5E. At electrodes of the chip, wires are bonded employing a ball bonding as shown in FIG. 5A or a wedge bonding as shown in FIG. 5B. In this case, the wedge bonding is preferable comparing to the ball bonding because the bonding pad can be reduced. Further, there might be a method of performing flip chip mounting as shown in FIG. 5C. FIG. 5D is a top view showing a case where the wedge bonding in FIG. 5B is applied. As can be understood from FIG. 5D, a pad 76 is smaller than a pad 75 in the case of effecting ball bonding. It is because the pad when effecting the ball bonding requires 100 $\mu$m–120 $\mu$m for a ball diameter +$\alpha$. In the case of the wedge bonding, however, 25 $\mu$m–50 $\mu$m for a wire diameter may suffice. FIG. 5E is a top view when the flip chip mounting in FIG. 5C is applied. As can be understood from FIG. 5E, pads 77, 78 are further reduced as compared with the pad 75 for ball bonding. The reason for this is that the pad of several to several tens $\mu$m may be enough for forming a solder bump for executing the flip chip mounting. Moreover, the electrodes may suffice if provided normally in two positions (either one or both of 77 and 78). It is, however, much better to provide all of four electrodes for the firm securing as in the case of FIG. 5E. These electrodes are, after being connected, fixed by molding them with resin, thus coming to a completion.

Embodiment 6

Figure 4:
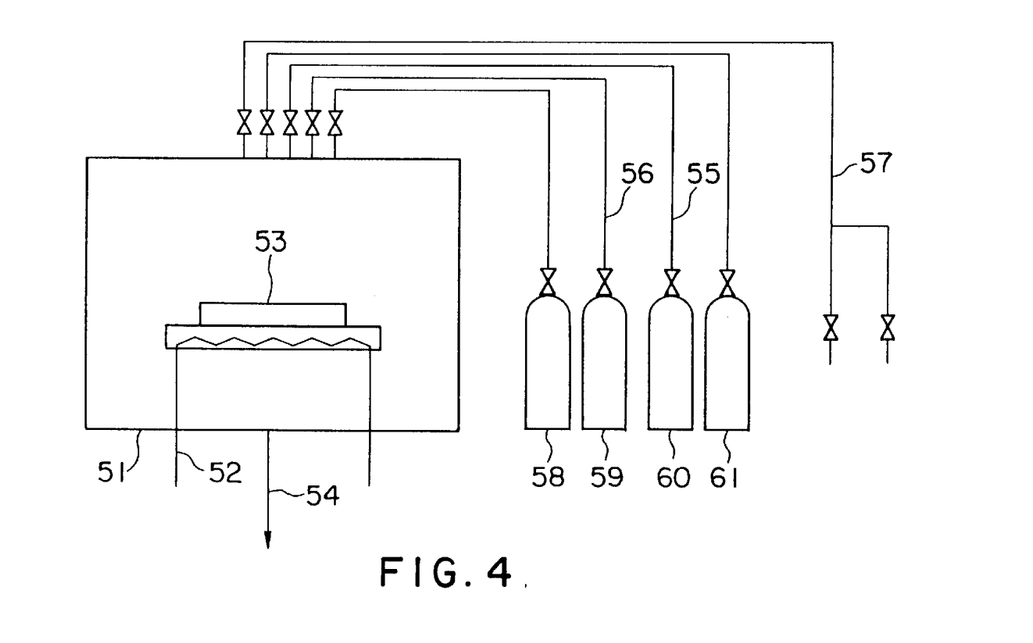
FIG. 4 is a schematic diagram showing an MO-CVD device.

A sixth embodiment of the present invention will be discussed by exemplifying the gallium nitride system compound semiconductor described so far. The explanation is given referring to FIGS. 2 and 4. FIG. 4 is a sectional view illustrating an MO-CVD device schematized to describe the sixth embodiment. Connected to a growth chamber 51 are a pipe 57 for supplying a carrier gas, a pipe for supplying V-group such as ammonia and so on, a pipe 58 for supplying III-group such as TMG, etc., a pipe 56 for supplying an n-type dopant 59, and a pipe 55 for supplying a background compensation gas 60 (hereinafter simply termed a compensation gas). The gases contributing to the growth are supplied from this growth chamber 51. Then, after being reacted, the remaining gas that did not contribute to the growth is discharged into a gas discharge processing device via a discharge pipe 54. A substrate 53 is disposed above a heater 52 inside the growth chamber, and a gallium nitride system compound semiconductor layer is grown by supplying the above growth gases.

By the way, a gist of the present invention is to provide a grown layer formed by increasing eh impurity concentration from the side of the substrate. Hence, there is, as a matter of course, included the impurity profiles (A)–(D) in FIG. 2 obtained by decrementing the substrate-side background impurity concentration and incrementing it in the growth direction.

Hereinafter, this forming method involving the use of the apparatus shown in FIG. 4 will be explained. An interior of the device is supplied with a compensation gas 60 such as $O_2$, etc. of 1 ppm or under (e.g., on the order of 1 ppb) of a total flow quantity, in addition to the carrier gas and the growth gases. A supply quantity of this compensation gas is reduced starting from a lower limit down to the background level. Alternatively, while the background level is lowered by the compensation gas, the doping gas such as $SiH_4$, etc. is, for instance, sequentially incremented and thus supplied. A desired impurity concentration profile among the profiles (A)–(D) can be provided by those methods.

Embodiment 7

Figure 6A:
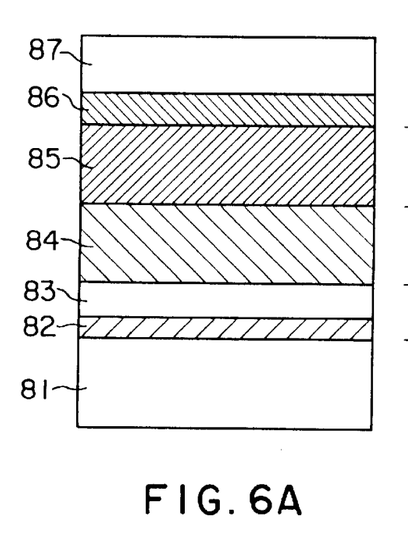
FIG. 6A is a sectional view illustrating the light emitting device containing an anisotype heterostructure.
Figure 6B:
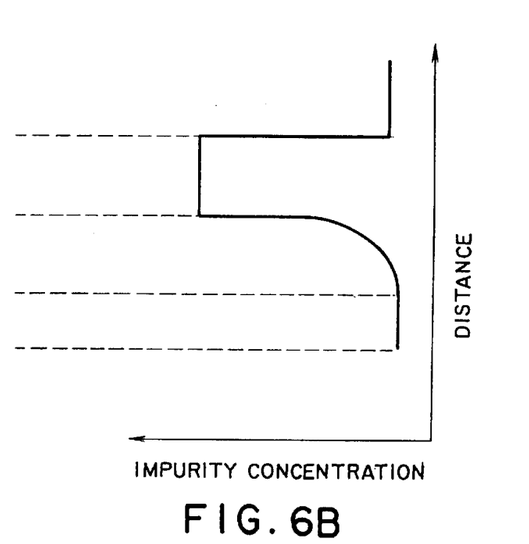
FIG. 6B is a diagram showing a profile of the p-type impurity of the light emitting device.

A seventh embodiment of the present invention will be discussed with reference to FIGS. 6A and 6B. FIG. 6A is a sectional view illustrating the light emitting device containing an anisotype heterostructure provided with a plurality of grown layers based on the epitaxial growth. FIG. 6B shows a profile of the p-type impurity of the light emitting device, corresponding to FIG. 6A. In FIG. 6B, the axis abscissa indicates the impurity concentration of the p-type impurity, and the axis of ordinates indicates the distance from the substrate, corresponding to FIG. 6A.

The anisotype heterostructure may contain one of the following various heterojunctions of GaAs/Si.InP/GaAs.GaN/Al$_2$O$_3$.GaN/Si.GaN/SiC, etc.

The light emitting device of the present invention is constructed of a buffer layer 82 having a thickness of 0.01–2.00 $\mu$m and composed of amorphous GaN, a p-type modulation doped layer 84 having a thickness of 0.01 $\mu$m–0.5 $\mu$m with an impurity concentration of the p-type impurity such as Be, Mg and Ca changing from a background level of, e.g., $1\times10^{13}$ atoms•cm$^{-3}$ to a desired impurity concentration of, e.g., $1\times10^{23}$ atoms•cm$^{-3}$, a high concentration p-type layer 85 that is 0.01 $\mu$m or larger in thickness, a p-impurity concentration of which is a desired concentration on the order of, e.g., $1\times10^{18}$ atoms•cm$^{-3}$ to $1\times10^{23}$cm$^{-3}$, an active layer 86 having a thickness of 0.01 $\mu$m–0.03 $\mu$m and composed of InGaN, and an AlGaN layer 87 having a thickness of 0.01 $\mu$m–2.0 $\mu$m and doped with n-type impurity, which are provided on the surface of a substrate 81 composed of sapphire.

Note that the above layer thicknesses and impurity concentrations are not limited to the numerical values given above for the same reason elucidated in the embodiment 1.

Incidentally, the layer stacking construction are not confined to the above sorts but may be formed by use of a variety of gallium nitride system compound semiconductors. For example, the substrate 11 may be composed of SiC, GaAs, Si in addition to sapphire. Further, the first GaN layer may be composed of In$_x$Al$_y$Ga$_{1-(x+y)}$, and the second and third GaN layers may be composed of Al$_x$Ga$_{(1-x)}$N. Moreover, the InGaN layer ma be composed of In$_n$Ga$_{(1-x)}$N, and the AlGaN layer may be composed of Al$_x$Ga$_{(1-x)}$N. Further, the fourth GaN layer may be composed of In$_x$Al$_y$Ga$_{1-(x+y)}$N (the above x and y are 0 or 1).

Subsequently, a method of manufacturing the light emitting diode of the present invention in FIG. 1 will be discussed.

To start with, the sapphire substrate 11 is placed in a reactive chamber and heated at 500° C.–600° C. Next, hydrogen, or nitrogen or their mixed gas as a carrier gas, and ammonia (NH$_3$) and trimethyl gallium (TMGa) as raw gasses are introduced into the reactive chamber, thereby forming an amorphous first GaN layer 12. Next, the temperature in the reactive chamber is increased up to 1000° C.–1100° C. Then, the same gases are introduced thereinto, and, together therewith, SiH$_4$ (silane gas) is introduced for doping the N-type impurity. The layer to be grown herein is so formed as to gradually increase the N-type impurity concentration. This control can, however, be easily done by regulating a flow quantity of silane gas. That is, if the silane gas flow quantity is increases exponent-functionwise with the growth of the GaN layer, the impurity concentration of the N-type modulation doped layer formed corresponding thereto can be also increased exponent-functionwise. Further, if formed by rectilinearly increasing the impurity concentration, the flow quantity of the silane gas may be incremented. If formed by increasing the impurity concentration curvilinearly of saturation, the flow quantity of silane gas may be incremented curvilinearly of saturation. Further if formed by increasing the impurity concentration stepwise, the flow quantity of silane gas may also be incremented stepwise.

Incidentally, as one example according to the present invention, the layer may be formed by changing the silane gas concentration to approximately 1 ppm and the flow quantity to approximately 0–200 sccm, and the layer also thereby formed while changing he impurity concentration of the second GaN layer to a desired value.

Next, the InGaN layer is formed by introducing TMI (trimethyl indium) while keeping the temperature in the reaction chamber as it is or slightly lowering it. Further, an AlGaN layer introduced with the P-type impurity is formed by introducing TMAl (trimethyl aluminum) and Cp$_2$Mg (biscyclo-penta-dienyl-magnesium). Moreover, a GaN contact layer is formed by introducing TMGa (trimethyl gallium), NH$_3$, and Cp$_2$Mg. The manufacturing process of the light emitting diode according to the present invention is completed as one example by executing the above steps.

Note that mainly the construction of the light emitting diode and the manufacturing method thereof have been described by way of the embodiments given above, however, the present invention can be applied to light emitting devices such as a semiconductor laser, etc. within the range of the present invention without departing from the gist of the invention.

According to the present invention, the N-type modulation doped layer and the high-concentration N-type layer can be provided on the surface of the buffer layer with stabilized crystallinity without any abnormal growth only by consecutively changing the flow quantity of silane gas, which does not require the formation of the undoped monocrystalline GaN layer as a spacer layer provided in the prior art light emitting device. That is, the N-type layer contributing directly to the operation can be provided on unnecessary spacer layer, and hence it is feasible to prevent the throughout from decreasing due to the formation of the spacer layer. Further, as no spacer layer is formed, the thickness of the entire light emitting device is reduced to some extent. It is therefore possible to prevent an increment in distortion quantity due to mismatching of lattice and also a deterioration of the grown layer.

What is claimed is:

1. A light emitting device comprising:
    a substrate;
    a first N-type gallium nitride system compound semiconductor layer provided on said substrate so as to increase an impurity concentration from a first impurity concentration of an N-type impurity to a second impurity concentration of the N-type impurity;
    a second N-type gallium nitride system compound semiconductor layer having the second impurity concentration of the N-type impurity and provided on said first N-type gallium nitride system compound semiconductor layer; and
    a P-type gallium nitride system semiconductor layer provided on said second N-type gallium nitride system compound semiconductor layer.

2. The light emitting device according to claim 1, wherein an impurity concentration of the N-type impurity in said first N-type gallium nitride system compound semiconductor layer changes exponent-functionwise corresponding to a layer thickness.

3. The light emitting device according to claim 1, wherein an impurity concentration of the N-type impurity in said first N-type gallium nitride system compound semiconductor layer changes rectilinearly corresponding to a layer thickness.

4. The light emitting device according to claim 1, wherein an impurity concentration of the N-type impurity in said first N-type gallium nitride system compound semiconductor layer changes curvilinearly of saturation corresponding to a layer thickness.

5. The light emitting device according to claim 1, wherein an impurity concentration of the N-type impurity in said first N-type gallium nitride system compound semiconductor layer changes stepwise corresponding to a layer thickness.

6. The light emitting device according to claim 2, wherein the impurity concentration of said first N-type impurity concentration falls within a range of $1\times10^{13}$ atoms·cm$^{-3}$ to $1\times10^{23}$ atoms·cm$^{-3}$.

7. The light emitting device according to claim 1, wherein a thickness of said first N-type gallium nitride compound semiconductor layer falls within a range of 0.01 to 0.05 μm.

8. A light emitting device comprising:

a substrate;

a first N-type gallium nitride system compound semiconductor layer provided on the surface of said substrate and having a first impurity concentration;

a second N-type gallium nitride system compound semiconductor layer provided on the surface of said first N-type gallium nitride system compound semiconductor layer; with its impurity concentration changing from said first impurity concentration to a second impurity concentration corresponding to a layer thickness;

a third N-type gallium nitride system compound semiconductor layer provided on the surface of said second N-type gallium nitride system compound semiconductor layer and having said second impurity concentration; and a P-type gallium nitride system compound semiconductor layer provided on said third N-type gallium nitride system compound semiconductor layer.

9. A light emitting device comprising:

a substrate;

a first P-type gallium nitride system compound semiconductor layer provided on said substrate so as to increase an impurity concentration from a first impurity concentration of a P-type impurity to a second impurity concentration of the P-type impurity; and a second P-type gallium nitride system compound semiconductor layer having the second P-type impurity concentration and provided on said first P-type gallium nitride system compound semiconductor layer.

10. The light emitting device according to claim 9, wherein a P-type impurity concentration of said first P-type gallium nitride system compound semiconductor layer changes rectilinearly corresponding to a layer thickness.

11. The light emitting device according to claim 9, wherein a P-type impurity concentration of said first P-type gallium nitride system compound semiconductor layer changes exponent-functionwise corresponding to a layer thickness.

12. The light emitting device according to claim 9, wherein a P-type impurity concentration of said first P-type gallium nitride system compound semiconductor layer changes curvilinearly of saturation corresponding to a layer thickness.

13. The light emitting device according to claim 9, wherein a P-type impurity concentration of said first P-type gallium nitride system compound semiconductor layer changes stepwise corresponding to a layer thickness.

14. The light emitting device according to claim 9, wherein the impurity concentration of said first P-type impurity concentration falls within a range of $1\times10^{13}$ atoms·cm$^{-3}$ to $1\times10^{23}$ atoms·cm$^{-3}$.

15. The light emitting device according to claim 9, wherein a thickness of said first P-type gallium nitride compound semiconductor layer falls within a range of 0.01 to 0.5 μm.

* * * * *